(12) United States Patent
Okada et al.

(10) Patent No.: US 8,592,324 B2
(45) Date of Patent: Nov. 26, 2013

(54) METHOD FOR FORMING LAMINATED STRUCTURE INCLUDING AMORPHOUS CARBON FILM

(75) Inventors: Mitsuhiro Okada, Nirasaki (JP); Yukio Tojo, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 13/019,553

(22) Filed: Feb. 2, 2011

(65) Prior Publication Data

US 2011/0195580 A1    Aug. 11, 2011

(30) Foreign Application Priority Data

Feb. 5, 2010    (JP) ................................. 2010-023922

(51) Int. Cl.
*H01L 21/31*    (2006.01)
*C23C 16/52*    (2006.01)

(52) U.S. Cl.
USPC ........................................................ 438/763

(58) Field of Classification Search
CPC ....... H01L 21/31; H01L 21/314; H01L 21/02; C23C 16/26; C23C 16/32; C23C 16/34; C23C 16/40; C23C 16/44; C23C 16/52
See application file for complete search history.

(56) References Cited

U.S. PATENT DOCUMENTS

| | | | | |
|---|---|---|---|---|
| 6,630,396 B2* | 10/2003 | Yang et al. | ..................... | 438/628 |
| 7,910,210 B2* | 3/2011 | Kreupl et al. | ................. | 428/408 |
| 2004/0188675 A1* | 9/2004 | Kaji | ................................. | 257/40 |
| 2005/0167839 A1 | 8/2005 | Wetzel et al. | | |
| 2006/0234515 A1* | 10/2006 | Aoyama et al. | ................ | 438/758 |
| 2009/0026588 A1* | 1/2009 | Miyatani et al. | .............. | 257/632 |
| 2009/0085172 A1* | 4/2009 | Horigome et al. | ............. | 257/632 |
| 2009/0203227 A1* | 8/2009 | Hasebe et al. | ................. | 438/787 |
| 2010/0163525 A1* | 7/2010 | Lee et al. | ......................... | 216/41 |

FOREIGN PATENT DOCUMENTS

| | | |
|---|---|---|
| JP | 2007-523034 | 8/2007 |
| JP | 4090740 | 5/2008 |
| KR | 10-2009-0036082 | 4/2009 |
| WO | WO 01/80309 A2 | 10/2001 |
| WO | WO 2009096251 * | 8/2009 |

OTHER PUBLICATIONS

Office Action issued on Jul. 16, 2013 in corresponding Korean Patent Application No. 10-2011-0009311.

* cited by examiner

*Primary Examiner* — Walter H Swanson

(74) *Attorney, Agent, or Firm* — Oblon, Spivak, McClelland, Maier & Neustadt, L.L.P.

(57) ABSTRACT

A method for forming a laminated structure including an amorphous carbon film on an underlying layer includes forming an initial layer containing Si—C bonds on a surface of the underlying layer, by supplying an organic silicon gas onto the underlying layer; and forming the amorphous carbon film by thermal film formation on the underlying layer with the initial layer formed on the surface thereof, by supplying a film formation gas containing a hydrocarbon compound gas onto the underlying layer.

20 Claims, 7 Drawing Sheets

| Number of cycles | 1 | 3 | 5 | 10 |
|---|---|---|---|---|
| Film thickness (nm) | 1 | 3 | 5 | 10 |
| Examination result | NG | OK | OK | OK |

METHOD FOR FORMING LAMINATED STRUCTURE INCLUDING AMORPHOUS CARBON FILM

CROSS-REFERENCE TO RELATED PATENT APPLICATIONS

This application claims the benefit of priority from Japanese Patent Application No. 2010-023922, filed on Feb. 5, 2010 in the Japan Patent Office, the disclosure of which is incorporated herein in the entirety by reference.

BACKGROUND OF THE INVENTION

1. Field of the Invention

The present invention relates to a semiconductor processing technique for forming a laminated structure including an amorphous carbon film on an underlying layer present on a target object, such as a semiconductor wafer. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In recent years, a hard mask formed of a laminated structure including an amorphous carbon film is often used as an etching mask in manufacturing semiconductor devices.

For example, Patent Document 1 (Jpn. Pat. Appln. KOHYOU Publication No. 2007-523034) discloses a hard mask of this kind formed of an amorphous carbon film.

However, amorphous carbon films are poor in adhesiveness to an underlying layer present therebelow or a film to be formed thereon.

BRIEF SUMMARY OF THE INVENTION

An object of the present invention is to provide a method and apparatus that can improve the adhesiveness between the underlying layer and amorphous carbon film. Another object of the present invention is to provide a method and apparatus that can improve the adhesiveness between the amorphous carbon film and upper film.

According to a first aspect of the present invention, there is provided a method for forming a laminated structure including an amorphous carbon film on an underlying layer, the method comprising: forming an initial layer containing Si—C bonds on a surface of the underlying layer, by supplying an organic silicon gas onto the underlying layer; and forming the amorphous carbon film by thermal film formation on the underlying layer with the initial layer formed on the surface thereof, by supplying a film formation gas containing a hydrocarbon compound gas onto the underlying layer.

According to a second aspect of the present invention, there is provided a method according to the first aspect, wherein, after said forming the amorphous carbon film, the method further comprises: forming an intermediate layer containing Si—C bonds on a surface of the amorphous carbon film, by supplying the organic silicon gas onto the amorphous carbon film; and forming a barrier film containing silicon nitride and having a predetermined thickness by thermal film formation on the amorphous carbon film with the intermediate layer formed on the surface thereof, by supplying a reactive gas containing nitrogen and supplying the organic silicon gas alternately onto the amorphous carbon film a plurality of times; and forming an upper film containing silicon on the barrier film such that the upper film is positioned above the amorphous carbon film in the laminated structure.

According to a third aspect of the present invention, there is provided a method according to the first aspect, wherein, after said forming the amorphous carbon film, the method further comprises: forming an intermediate layer containing Si—C bonds on a surface of the amorphous carbon film, by supplying the organic silicon gas onto the amorphous carbon film; and forming a barrier film containing silicon carbide and having a predetermined thickness by thermal film formation on the amorphous carbon film with the intermediate layer formed on the surface thereof, by supplying a reactive gas containing carbon and supplying the organic silicon gas alternately onto the amorphous carbon film a plurality of times; and forming an upper film containing silicon on the barrier film such that the upper film is positioned above the amorphous carbon film in the laminated structure.

According to a fourth aspect of the present invention, there is provided a method according to the first aspect, wherein, after said forming the amorphous carbon film, the method further comprises: forming an intermediate layer containing Si—C bonds and then forming a silicon carbide-containing film by thermal film formation on a surface of the amorphous carbon film, by supplying the organic silicon gas onto the amorphous carbon film; performing an annealing process on the silicon carbide-containing film in an inactive gas atmosphere at a temperature and a pressure respectively higher than those in said forming a silicon carbide-containing film by thermal film formation; and forming an upper film containing silicon on the silicon carbide-containing film such that the upper film is positioned above the amorphous carbon film in the laminated structure.

According to a fifth aspect of the present invention, there is provided an apparatus for forming a laminated structure including an amorphous carbon film on an underlying layer, the apparatus comprising: a process chamber configured to accommodate a target object including the underlying layer; a process gas supply mechanism configured to supply a process gas into the process chamber; a heating mechanism configured to activate a process gas supplied into the process chamber and to heat the target object accommodated inside the process chamber; an exhaust mechanism configured to exhaust gas from inside the process chamber; and a controller configured to control an operation of the apparatus and including a non-transitory storage medium storing a control program, which, when executed, controls the apparatus to conduct the method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
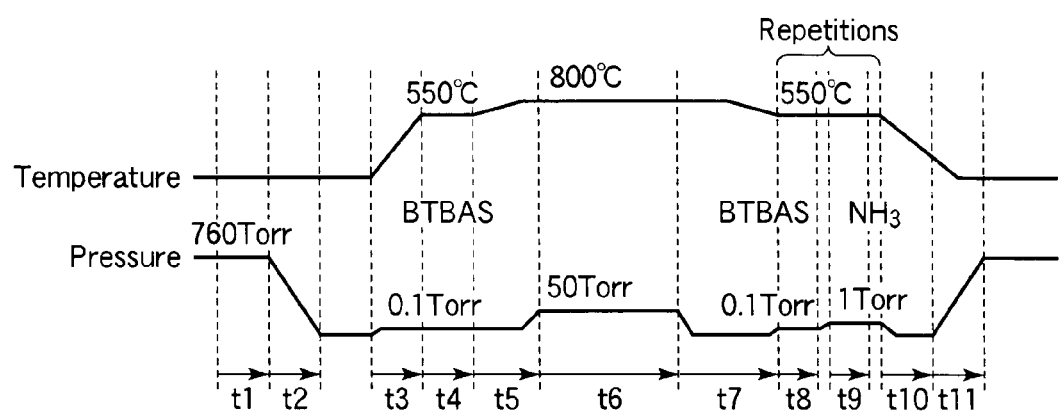
FIG. 1 is a time chart showing the sequence of a film formation method according to a first embodiment.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIG. 1 is a time chart showing the sequence of a film formation method according to a first embodiment. FIGS. 2A to 2F are sectional views schematically showing respective states of a target object in the sequence according to the first embodiment. For example, this sequence is designed to form a laminated structure including an amorphous carbon film, which is to be used as an etching mask (hard mask) in manufacturing semiconductor devices, as described previously.

At first, as indicated by a step t1 in FIG. 1, a target object (see FIG. 2A), such as a semiconductor substrate or silicon wafer 1 with $SiO_2$ film 2 formed thereon and having a thickness of about 100 nm is loaded into the process chamber of a film formation apparatus. The $SiO_2$ film 2 serves as an underlying layer on which an amorphous carbon film is to be formed.

Then, as indicated by a step t2, the pressure inside the process chamber is decreased from atmospheric pressure (760 Torr=$1.01 \times 10^5$ Pa) to a predetermined vacuum level, such as a value of less than 0.1 Torr (13.3 Pa).

Then, as indicated by a step t3, after the pressure inside the process chamber becomes stable, the target object is heated to a temperature, such as about 550° C. Further, the pressure inside the process chamber is increased from the predetermined vacuum level of less than 0.1 Torr to 0.1 Torr (13.3 Pa).

Figure 2A:
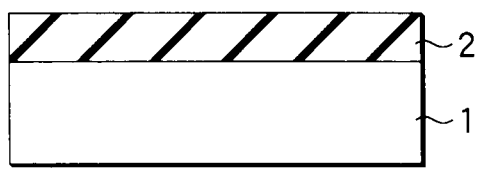
FIGS. 2A to 2F are sectional views schematically showing respective states of a target object in the sequence according to the first embodiment.
Figure 2D:
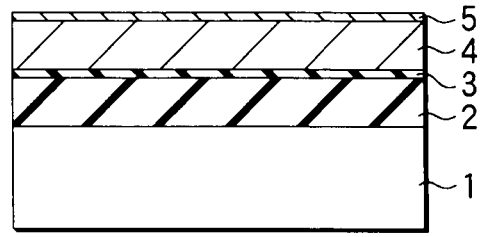
Figure 2B:
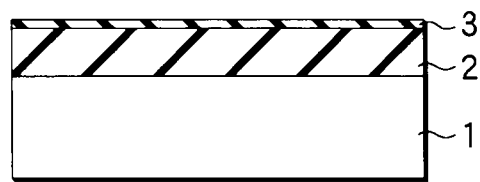
Figure 2E:
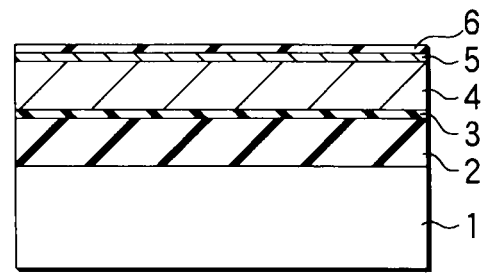

Then, as indicated by a step t4, after the pressure inside the process chamber and the temperature of the target object become stable, an organic silicon gas is supplied onto the surface of the $SiO_2$ film 2, so that an initial layer 3 containing Si—C bonds is formed on the surface of the $SiO_2$ film 2 (see FIG. 2B). For example, the organic silicon gas is an aminated compound gas containing silicon. The aminated compound gas containing silicon is exemplified by BAS (butylamino silane), BTBAS (bistertialbutylamino silane), DMAS (dimethylamino silane), BDMAS (bisdimethylamino silane), TDMAS (tridimethylamino silane), DEAS (diethylamino silane), BDEAS (bisdiethylamino silane), DPAS (dipropylamino silane), and DIPAS (diisopropylamino silane). In this embodiment, BTBAS is used for this purpose.

In this embodiment, the step t4 of forming the initial layer 3 is set to use process conditions, as follows.

BTBAS flow rate: 1 to 1,000 sccm, such as 100 sccm,
Process time: 0.1 to 60 min, such as 1 min,
Process temperature: 20 to 750° C., such as 550° C., and
Process pressure: 0.05 to 50 Torr, such as 0.1 Torr (13.3 Pa).

Then, as indicated by a step t5, the target object is heated to a film formation temperature, and the pressure inside the process chamber is increased to a film formation pressure.

Figure 2C:
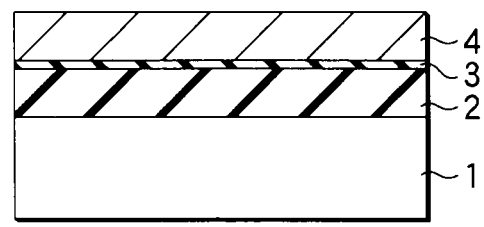
Figure 2F:
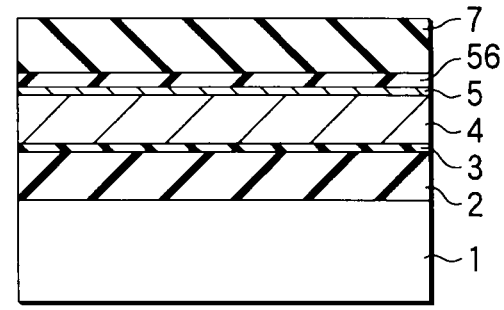

Then, as indicated by a step t6, after the pressure inside the process chamber and the temperature of the target object become stable, an amorphous carbon film 4 is formed by thermal film formation on the $SiO_2$ film 2 with the initial layer 3 containing Si—C bonds formed thereon (see FIG. 2C). The amorphous carbon film 4 is formed by supplying a film formation gas including a hydrocarbon compound gas onto the target object and thermally decomposing the hydrocarbon compound. The hydrocarbon compound gas is exemplified by $CH_4$ (methane), $C_2H_2$ (acetylene), $C_2H_4$ (ethylene), $C_2H_6$ (ethane), and $C_4H_6$ (butyne). In this embodiment, $C_2H_4$ is used for this purpose.

In this embodiment, the step t6 of forming the amorphous carbon film 4 is set to use process conditions, as follows.

$C_2H_4$ flow rate: 1 to 5,000 sccm, such as 1,000 sccm,
Film formation time: 0.1 to 600 min, such as 12.5 min,
Film formation temperature: 300 to 1,000° C., such as 800° C., and
Film formation pressure: 1 to 650 Torr, such as 50 Torr (6,650 Pa).

The term "thermal film formation" is defined by a film formation method for forming a film on a target object while activating the film formation gas only by heat, wherein the target object is heated directly or indirectly, in general. In this specification, a film formation method of this type is simply referred to as "thermal film formation".

Then, as indicated by a step t7, the interior of the process chamber is exhausted, and then the target object is set at a temperature lower than the film formation temperature, and the pressure inside the process chamber is set at a pressure lower than the film formation pressure.

Then, as indicated by a step t8, after the pressure inside the process chamber and the temperature of the target object become stable, an organic silicon gas is supplied onto the amorphous carbon film 4. Then, the organic silicon gas is purged by an inactive gas (such as nitrogen gas). Then, as indicated by a step t9 in FIG. 1, a nitrogen-containing gas (reactive gas) is supplied. Then, the nitrogen-containing gas is purged by an inactive gas (such as nitrogen gas). Further, this cycle alternately including the organic silicon gas supply (step t8) and the nitrogen-containing gas supply (step t9) is repeated.

In this case, the intermediate layer 5 containing Si—C bonds is first formed on the surface of the amorphous carbon film 4 (see FIG. 2D). Then, the intermediate layer 5 containing Si—C bonds is nitrided, and a thin film 6 containing silicon nitride is formed by thermal film formation on the amorphous carbon film (see FIG. 2E). Then, the organic silicon gas supply (step t8) and the nitrogen-containing gas supply (step t9) are repeated a plurality of times (ALD process), so that a barrier film 56 containing silicon nitride is formed with a predetermined thickness by thermal film formation. When the steps t8 and t9 are finished, there is obtained a state where a very thin intermediate layer 5 serving as an adhesive layer is present between the amorphous carbon film 4 and barrier film 56. However, in the drawings, the thicknesses of layers and films are not exact for the sake of convenience.

For example, the organic silicon gas used in step t8 is an aminated compound gas containing silicon. The aminated compound gas containing silicon is exemplified by BAS (butylamino silane), BTBAS (bistertialbutylamino silane), DMAS (dimethylamino silane), BDMAS (bisdimethylamino silane), TDMAS (tridimethylamino silane), DEAS (diethylamino silane), BDEAS (bisdiethylamino silane), DPAS (dipropylamino silane), and DIPAS (diisopropylamino silane). In this embodiment, BTBAS is used for this purpose.

In this embodiment, the step t8 of forming the intermediate layer 5 is set to use process conditions, as follows.
BTBAS flow rate: 1 to 1,000 sccm, such as 100 sccm,
Process time: 0.1 to 60 min, such as 5 min,
Process temperature: 20 to 750° C., such as 550° C., and
Process pressure: 0.05 to 50 Torr, such as 0.1 Torr (13.3 Pa).

The nitrogen-containing gas used in step t9 is exemplified by $NH_3$ (ammonia).

In this embodiment, the step t9 of forming the thin film 6 is set to use process conditions, as follows.
$NH_3$ flow rate: 1 to 5,000 sccm, such as 1,000 sccm,
Process time: 0.1 to 60 min, such as 5 min,
Process temperature: 20 to 750° C., such as 550° C., and
Process pressure: 0.05 to 750 Torr, such as 1 Torr (133 Pa).

Where the cycle including the steps t8 and t9 is performed once (no repetition) under the process conditions described above (specified by the values following "such as"), the barrier film 56 is formed to have a thickness of about 1 nm. Accordingly, under the process conditions described above, where the cycle including the steps t8 and t9 is performed three times (the repetition number is three), the barrier film 56 is formed to have a thickness of about 3 nm; where the cycle is performed five times (the repetition number is five), the barrier film 56 is formed to have a thickness of about 5 nm; where the cycle is performed ten times (the repetition number is ten), the barrier film 56 is formed to have a thickness of about 10 nm; and so on.

After the steps t8 and t9 are repeated a predetermined number of times, the temperature of the target object is decreased, while the interior of the process chamber is exhausted, as indicated by a step t10. Subsequent to this exhaust, as indicated by a step t11, the temperature of the target object is decreased sequentially from the former step, while a purge gas is supplied into the process chamber. After the temperature of the target object is sufficiently lowered and the pressure inside the process chamber is returned to atmospheric pressure, the target object is unloaded from the process chamber.

Thereafter, the target object is transferred into the process chamber of another film formation apparatus, and an upper film 7 is formed on the barrier film 56, wherein the upper film 7 is positioned above the amorphous carbon film 4 in the laminated structure. In this embodiment, an $SiO_2$ film is formed by a CVD process as the upper film 7 on the barrier film 56 (see FIG. 2F).

According to the first embodiment described above, the initial layer 3 containing Si—C bonds is first formed on the surface of the $SiO_2$ film 2 serving as the underlying layer. Consequently, the adhesiveness between the underlying layer and amorphous carbon film 4 is advantageously improved, as compared with a case where no initial layer 3 containing Si—C bonds is formed.

Further, where the initial layer 3 containing Si—C bonds is formed on the surface of the $SiO_2$ film 2 serving as the underlying layer, the surface roughness of the amorphous carbon film 4 is also advantageously improved. One of the reasons for the surface roughness of the amorphous carbon film 4 being improved resides in that the amorphous carbon film 4 more uniformly grows on the underlying layer because the adhesiveness between the underlying layer and amorphous carbon film 4 is improved.

Further, in the first embodiment, as indicated by the steps t8 and t9, an ALD process is adopted such that the organic silicon gas supply (step t8) and the nitrogen-containing gas supply (step t9) are alternately repeated. In this case, the intermediate layer 5 containing Si—C bonds is formed on the surface of the amorphous carbon film 4, and then the barrier film 56 containing silicon nitride is formed by thermal film formation on the amorphous carbon film 4 with the intermediate layer 5 containing Si—C bonds formed on the surface. Consequently, the adhesiveness between the amorphous carbon film 4 and upper film 7 becomes advantageously higher, as compared with a case where no intermediate layer 5 containing Si—C bonds is formed or the barrier film 56 is formed not by thermal film formation using an ALD process. Further, where the barrier film 56 is formed by thermal film formation using an ALD process, the film quality becomes dense. Consequently, the barrier film 56 well serves as an oxidization barrier to prevent the amorphous carbon film 4 from being oxidized. It follows that, even where the target object with the barrier film 56 formed thereon is opened to the atmosphere, the adhesiveness can be hardly deteriorated.

Figures 3, 4:
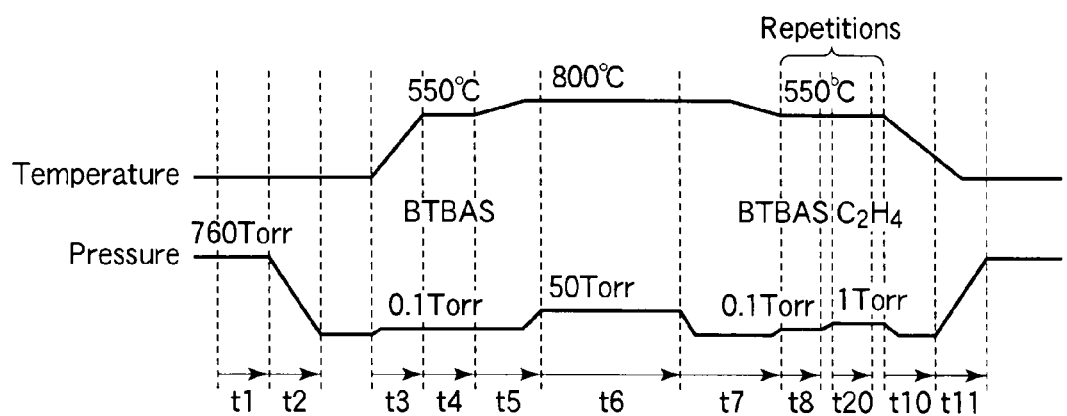
FIG. 3 is a diagram showing results of an adhesiveness examination.
FIG. 4 is a time chart showing the sequence of a film formation method according to a second embodiment.
Figure 5A:
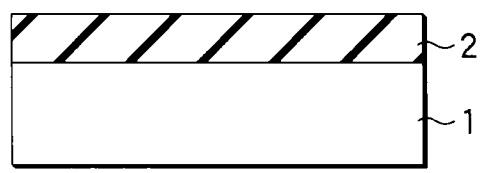
FIGS. 5A to 5F are sectional views schematically showing respective states of a target object in the sequence according to the second embodiment.
Figure 5D:
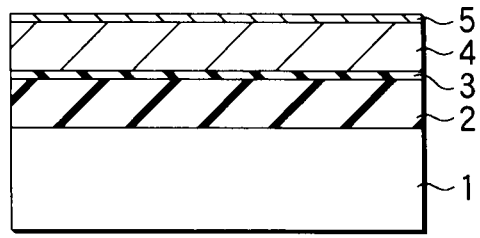
Figure 5B:
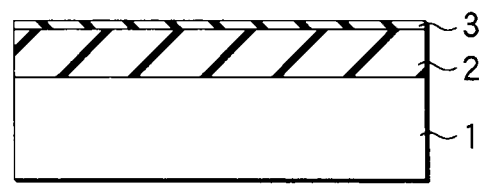
Figure 5E:
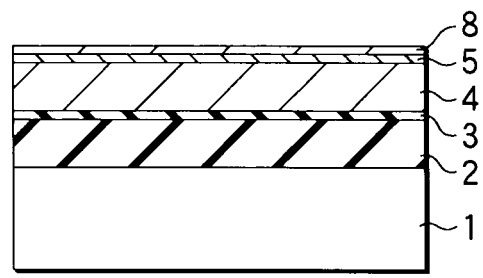
Figure 5C:
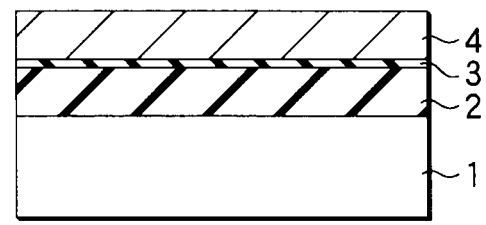
Figure 5F:
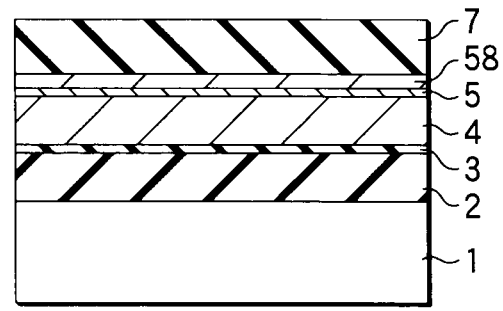

FIG. 3 is a diagram showing results of an adhesiveness examination, depending on the number of repetitions of the organic silicon gas supply (step t8) and the nitrogen-containing gas supply (step t9).

The adhesiveness was examination based on whether the upper film 7 peeled off by an operation of attaching an adhesive tape onto the upper film 7 ($SiO_2$ film in this examination) and then detaching the tape.

As shown in FIG. 3, in the examination results, where the organic silicon gas supply (step t8) and the nitrogen-containing gas supply (step t9) were alternately repeated 3 times or more, the upper film 7 did not peel off. On the other hand, where the organic silicon gas supply (step t8) and the nitrogen-containing gas supply (step t9) were not repeated, the upper film 7 peeled off.

As described above, where the organic silicon gas supply (step t8) and the nitrogen-containing gas supply (step t9) are alternately repeated, the adhesiveness between the amorphous carbon film 4 and upper film 7 formed thereabove is advantageously improved as compared with a case where these steps are not repeated.

Second Embodiment

FIG. 4 is a time chart showing the sequence of a film formation method according to a second embodiment. FIGS. 5A to 5F are sectional views schematically showing respective states of a target object in the sequence according to the second embodiment.

In FIG. 4 and FIGS. 5A to 5F, the same portions as those in FIG. 1 and FIGS. 2A to 2F are denoted by the same reference numerals, and only portions different from those of the first embodiment will be explained.

As shown in FIG. 4, the second embodiment differs from the first embodiment in that a step t20 of supplying a carbon-containing gas (reactive gas) is used in place of the step t9 of supplying the nitrogen-containing gas (reactive gas). For example, the carbon-containing gas is a hydrocarbon compound gas. The hydrocarbon compound gas is exemplified by CH₄ (methane), $C_2H_2$ (acetylene), $C_2H_4$ (ethylene), $C_2H_6$ (ethane), and $C_4H_6$ (butyne). In this embodiment, $C_2H_4$ is used for this purpose.

In this embodiment, the step t20 is set to use process conditions, as follows.

$C_2H_4$ flow rate: 1 to 5,000 sccm, such as 1,000 sccm,
Film formation time: 0.1 to 30 min, such as 0.5 min,
Film formation temperature: 20 to 750° C., such as 550° C., and
Film formation pressure: 0.05 to 750 Torr, such as 1 Torr (133 Pa).

Also in this second embodiment, subsequent to the step t7, the cycle alternately including the organic silicon gas supply (step t8) and the carbon-containing gas supply (step t20) is repeated. In this case, the intermediate layer 5 containing Si—C bonds is first formed on the surface of the amorphous carbon film 4 (see FIG. 5D). Then, the intermediate layer 5 containing Si—C bonds is carbonized, and a thin film 8 containing silicon carbide is formed by thermal film formation on the amorphous carbon film 4 (see FIG. 5E). Then, the organic silicon gas supply (step t8) and the carbon-containing gas supply (step t20) are repeated a plurality of times (ALD process), so that a barrier film 58 containing silicon carbide is formed with a predetermined thickness by thermal film formation. When the steps t8 and t20 are finished, there is obtained a state where a very thin intermediate layer 5 serving as an adhesive layer is present between the amorphous carbon film 4 and barrier film 58. However, in the drawings, the thicknesses of layers and films are not exact for the sake of convenience.

Consequently, the adhesiveness between the amorphous carbon film 4 and upper film 7 becomes advantageously higher, as compared with a case where no intermediate layer 5 containing Si—C bonds is formed or the barrier film 58 is formed not by thermal film formation using an ALD process. Further, where the barrier film 58 is formed by thermal film formation using an ALD process, the film quality becomes dense, as in the barrier film 56. Consequently, the barrier film 58 well serves as an oxidization barrier to prevent the amorphous carbon film 4 from being oxidized. It follows that, even where the target object with the barrier film 58 formed thereon is opened to the atmosphere, the adhesiveness can be hardly deteriorated.

Third Embodiment

Figure 6:
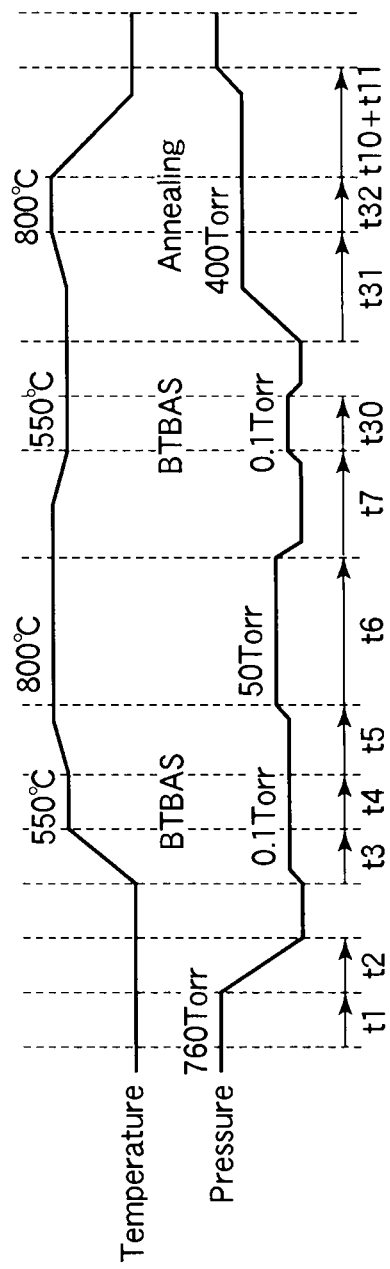
FIG. 6 is a time chart showing the sequence of a film formation method according to a third embodiment.

FIG. 6 is a time chart showing the sequence of a film formation method according to a third embodiment. FIGS. 7A to 7F are sectional views schematically showing respective states of a target object in the sequence according to the third embodiment.

In FIG. 6 and FIGS. 7A to 7F, the same portions as those in FIG. 1 and FIGS. 2A to 2F are denoted by the same reference numerals, and only portions different from those of the first embodiment will be explained.

As show in FIG. 6, the third embodiment differs from the first embodiment in that, in place of the steps t8 and t9, a step t30 of supplying an organic silicon gas onto the amorphous carbon film 4 and then a step t32 of performing an annealing process without supplying the organic silicon gas are used.

Figure 7A:
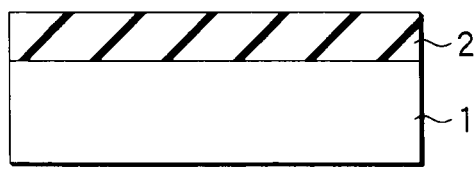
FIGS. 7A to 7F are sectional views schematically showing respective states of a target object in the sequence according to the third embodiment.
Figure 7B:
Figure 7C:
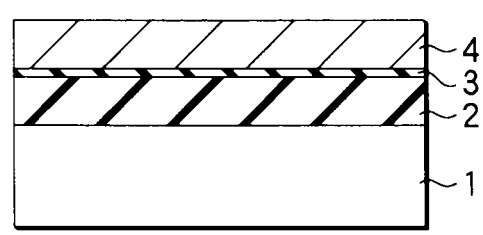
Figure 7D:
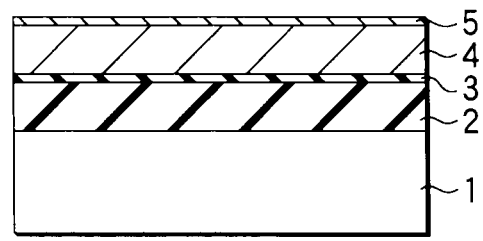
Figure 7E:
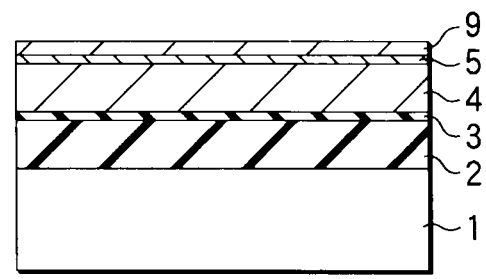
Figure 7F:
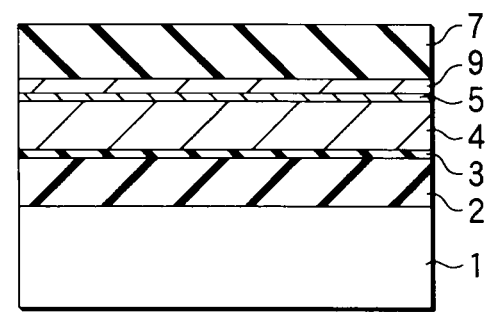

Also in this third embodiment, subsequent to the step t7, as indicated by a step t30, an organic silicon gas is supplied, so that the intermediate layer 5 containing Si—C bonds is formed on the surface of the amorphous carbon film 4 (see FIG. 7D). It should be noted that, where this step is performed for a certain period of time, this step can be considered as such a step of first forming the intermediate layer 5 containing Si—C bonds and then forming a silicon carbide-containing film 9 by thermal film formation thereon (see FIG. 7E).

For example, the organic silicon gas used in the step t30 is an aminated compound gas containing silicon. The aminated compound gas containing silicon is exemplified by BAS (butylamino silane), BTBAS (bistertialbutylamino silane), DMAS (dimethylamino silane), BDMAS (bisdimethylamino silane), TDMAS (tridimethylamino silane), DEAS (diethylamino silane), BDEAS (bisdiethylamino silane), DPAS (dipropylamino silane), and DIPAS (diisopropylamino silane). In this embodiment, BTBAS is used for this purpose.

In this embodiment, the step t30 is set to use process conditions, as follows.

BTBAS flow rate: 1 to 1,000 sccm, such as 100 sccm,
Process time: 0.1 to 60 min, such as 5 min,
Process temperature: 20 to 750° C., such as 550° C., and
Process pressure: 0.05 to 50 Torr, such as 0.1 Torr (13.3 Pa).

After the intermediate layer 5 containing Si—C bonds and silicon carbide-containing film 9 are formed on the amorphous carbon film 4 by the step t30, the interior of the process chamber is exhausted. Then, as indicated by a step t31, the pressure inside the process chamber is increased to a pressure higher than that of the step t30. Further, the temperature of the target object is increased to a temperature higher than that of the step t30.

Then, as indicated by a step t32, after the pressure inside the process chamber and the temperature of the target object become stable, an annealing process is performed on the target object in an inactive gas atmosphere by supplying an inactive gas into the process chamber. The inactive gas used in the step t32 is exemplified by nitrogen gas.

In this embodiment, the step t32 is set to use process conditions, as follows.

$N_2$ flow rate: 50 to 30,000 sccm, such as 1,000 sccm,
Process time: 0.5 to 300 min, such as 30 min,
Process temperature: 550 to 1,200° C., such as 800° C., and
Process pressure: 0.1 to 760 Torr, such as 400 Torr (53,200 Pa).

Also in this third embodiment, the intermediate layer 5 containing Si—C bonds is formed and then the silicon carbide-containing film 9 is formed by thermal film formation, both on the surface of the amorphous carbon film 4. Further, the silicon carbide-containing film 9 is subjected to an annealing process in an inactive gas atmosphere at a pressure and a temperature, respectively higher than the pressure and the temperature used when the silicon carbide-containing film 9 is formed by thermal film formation.

Consequently, the adhesiveness between the amorphous carbon film 4 and upper film 7 becomes advantageously higher, as compared with a case where no intermediate layer 5 containing Si—C bonds is formed or the silicon carbide-containing film 9 is not subjected to an annealing process.

Further, where the silicon carbide-containing film 9 is subjected to an annealing process, the film quality becomes dense, as in the barrier film 56. Consequently, the silicon carbide-containing film 9 well serves as an oxidization barrier to prevent the amorphous carbon film 4 from being oxidized. It follows that, even where the target object with the silicon carbide-containing film 9 formed thereon is opened to the atmosphere, the adhesiveness can be hardly deteriorated.

Fourth Embodiment

The fourth embodiment relates to one example of film formation apparatuses that can perform each of the film formation methods according to the first to third embodiments.

Figure 8:
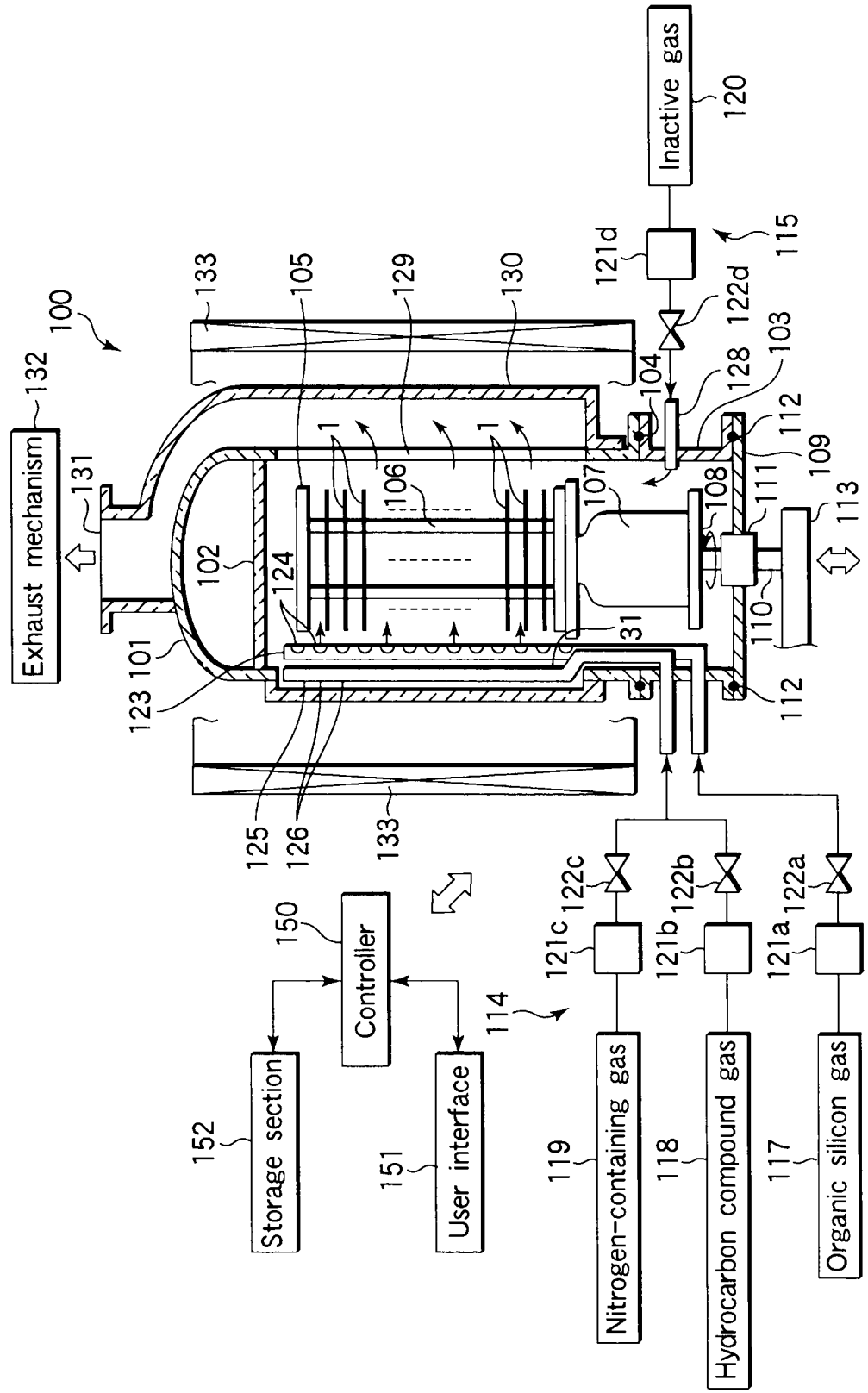
FIG. 8 is a sectional view schematically showing a film formation apparatus that can perform each of the film formation methods according to the first to third embodiments.

FIG. 8 is a sectional view schematically showing a film formation apparatus that can perform each of the film formation methods according to the first to third embodiments.

The film formation apparatus 100 includes a process chamber 101 shaped as a cylindrical column with an opened bottom and closed top. The entirety of the process chamber 101 is made of, e.g., quartz. The process chamber 101 is equipped with a quartz ceiling plate 102 disposed therein near the top. The opened bottom of the process chamber 101 is connected through a seal member 104, such as an O-ring, to a cylindrical manifold 103 made of, e.g., stainless steel.

The manifold 103 supports the bottom of the process chamber 101. A wafer boat 105 made of quartz is moved up and down through the bottom port of the manifold 103, so that the wafer boat 105 is loaded/unloaded into and from the process chamber 101. A number of, such as about 50 to 100, target objects formed of, e.g., semiconductor substrates or silicon wafers 1, as in this embodiment, are stacked on the wafer boat 105. In this embodiment, for example, an $SiO_2$ film is present on each of the silicon wafers 1 and serves as an underlying layer, on which a laminated structure including an amorphous carbon film is to be formed, as described above. The wafer boat 105 has three struts 106 with grooves on which a plurality of silicon wafers 1 are respectively supported.

The wafer boat 105 is placed on a table 108 through a heat-insulating cylinder 107 made of quartz. The table 108 is supported by a rotary shaft 110, which penetrates a lid 109 made of, e.g., stainless steel, and used for opening/closing the bottom port of the manifold 103. The portion of the lid 109 where the rotary shaft 110 penetrates is equipped with, e.g., a magnetic-fluid seal 111, so that the rotary shaft 110 is rotatably supported in an airtightly sealed state. A seal member 112, such as an O-ring, is interposed between the periphery of the lid 109 and the bottom of the manifold 103, so that the interior of the process chamber 101 can be kept sealed. For example, the rotary shaft 110 is attached at the distal end of an arm 113 supported by an elevating mechanism (not shown), such as a boat elevator. The elevating mechanism moves the wafer boat 105 by the lid 109 up and down into and from the process chamber 101.

The film formation apparatus 100 includes a process gas supply mechanism 114 for supplying gases used for processes into the process chamber 101, and a purge gas supply mechanism 115 for supplying a purge gas into the process chamber 101.

The process gas supply mechanism 114 includes an organic silicon gas supply source 117, a hydrocarbon compound gas supply source 118, and a nitrogen-containing gas supply source 119. The purge gas supply mechanism 115 includes an inactive gas supply source 120.

The organic silicon gas supply source 117 is connected to a distribution nozzle 123 through a flow rate controller 121a and a switching valve 122a. The distribution nozzle 123 is formed of a quartz pipe that penetrates the sidewall of the manifold 103 from outside and then turns and extends vertically upward. The vertical portion of the distribution nozzle 123 has a plurality of gas spouting holes 124 formed thereon at predetermined intervals over the vertical length corresponding to the wafer supporting span of the wafer boat 105. Consequently, the organic silicon gas is almost uniformly spouted in horizontal directions from the gas spouting holes 124 toward the inner side of the process chamber 101.

The hydrocarbon compound gas supply source 118 is connected to a distribution nozzle 125 through a flow rate controller 121b and a switching valve 122b. The nitrogen-containing gas supply mechanism 119 is also connected to the distribution nozzle 125 through a flow rate controller 121c and a switching valve 122c. The distribution nozzle 125 is formed of a quartz pipe that penetrates the sidewall of the manifold 103 from outside and then turns and extends vertically upward. The vertical portion of the distribution nozzle 125 has a plurality of gas spouting holes 126 formed thereon at predetermined intervals over the vertical length corresponding to the wafer supporting span of the wafer boat 105. Consequently, the hydrocarbon compound gas or nitrogen-containing gas is almost uniformly spouted in horizontal directions from the gas spouting holes 126 toward the inner side of the process chamber 101.

The purge gas supply source mechanism 115 includes an inactive gas supply source 120. The inactive gas supply source 120 is connected to a short nozzle 128 through a flow rate controller 121d and a switching valve 122d. The nozzle 128 is formed of a quartz pipe that penetrates the sidewall of the manifold 103 from outside and spouts an inactive gas from the distal end in a horizontal direction toward the inner side of the process chamber 101.

On the other hand, on the side of the process chamber 101 opposite to the distribution nozzles 123 and 125, the process chamber 101 has an exhaust port 129 formed thereon for exhausting the interior of the process chamber 101. The exhaust port 129 has a long narrow shape formed by cutting the sidewall of the process chamber 101 in the vertical direction. The exhaust port 129 is covered with an exhaust port cover member 130 having a U-shape cross-section and attached to the process chamber 101 by welding. The exhaust port cover member 130 extends upward along the sidewall of the process chamber 101, and has a gas outlet 131 at the top of the process chamber 101. The gas outlet 131 is connected to an exhaust mechanism 132 including a vacuum pump and so forth. The interior of the process chamber 101 is exhausted by the exhaust mechanism 132 to remove process gases used for processes and to adjust the pressure inside the process chamber 101 to process pressures in accordance with processes.

The process chamber 101 is surrounded by a cylindrical heating mechanism 133. The heating mechanism 133 is used to activate gases supplied into the process chamber 101 and to heat the target objects formed of, e.g., semiconductor substrates or silicon wafers 1, as in this embodiment, inside the process chamber 101.

The film formation apparatus 100 includes a controller 150 comprising a microprocessor (computer), which controls the respective components in the film formation apparatus 100. The controller 150 is connected to the user interface 151, which includes, e.g., a keyboard and a display, wherein the keyboard is used for an operator to input commands for operating the film formation apparatus 100, and the display is used for showing visualized images of the operational status of the film formation apparatus 100.

Further, the controller 150 is connected to a storage section 152. The storage section 152 stores recipes, i.e., control programs for the controller 150 to control the film formation apparatus 100 so as to perform various processes, and control programs for the respective components of the film formation apparatus 100 to perform processes in accordance with process conditions. The recipes are stored in a storage medium included in the storage section 152. The storage medium may be formed of a medium of the stationary type, such as a hard disk or semiconductor memory, or a medium of the portable type, such as a CD-ROM, DVD, or flash memory. Alternatively, the recipes may be used online while they are transmitted from another apparatus through, e.g., a dedicated line, as needed.

A required recipe is retrieved from the storage section 152 and executed by the controller 150 in accordance with an instruction or the like input through the user interface 151. Consequently, the film formation apparatus 100 can perform a predetermined process in accordance with the retrieved recipe under the control of the controller 150.

In this embodiment, under the control of the controller 150, the film formation methods according to the first to third embodiments are performed except for the part for forming the upper film 7. Specifically, the controller 150 is used to sequentially perform the processes of the steps t1 to t11 shown in FIG. 1, to sequentially perform the processes of the steps t1 to t8, t20, and t10 to t11 shown in FIG. 4, or to sequentially perform the processes of the steps t1 to t7, t30 to t32, and t10+t11 shown in FIG. 6.

As described above, the film formation methods according to the first to third embodiments can be performed by use of the film formation apparatus 100 shown in FIG. 8. Where the film formation apparatus 100 is used, the processes of each of the film formation methods according to the first to third embodiments, except for the part for forming the upper film 7, can be sequentially performed in one process chamber 101 without being opened to the atmosphere.

The film formation apparatus 100 is equipped with the nitrogen-containing gas supply source 119. However, the nitrogen-containing gas supply source 119 may be omitted, where the second or third embodiment is conducted. If the nitrogen-containing gas supply source 119 is omitted, the step t20 of the second embodiment can be performed by supplying the carbon-containing gas from the hydrocarbon compound gas supply source 118, for example.

The present invention has been explained with references to several embodiments, but the present invention is not limited to the embodiments described above, and it may be modified in various manners.

For example, it is preferable to improve both of the adhesiveness between the amorphous carbon film and underlying layer and the adhesiveness between the amorphous carbon film and upper film. However, only one of them may be addressed. For example, where the upper film is not formed, only the steps t1 to t6 are performed to improve the adhesiveness between the amorphous carbon film and underlying layer.

In the embodiments described above, the amorphous carbon film is formed on the flat underlying layer and the upper film is formed on the flat amorphous carbon film. However, the embodiments described above are conducted by use of a thermal film formation process, which is good in step coverage. Consequently, there will be no problem even if the amorphous carbon film is formed on a stepped underlying layer and the upper film is formed on a stepped amorphous carbon film.

In the embodiments described above, each of the underlying layer and upper film is made of $SiO_2$, but the underlying layer and upper film are not limited to $SiO_2$. For example, each of the underlying layer and upper film may be another material containing silicon, because such a modification can also generate Si—C bonds between the amorphous carbon film and underlying layer and between the amorphous carbon film and upper film.

In the embodiments described above, the present invention is applied to a film formation apparatus of the batch type, but the present invention may be alternatively applied to a film formation apparatus of the single-substrate type.

In the embodiments described above, specific process conditions are shown, but they are mere examples, because of the following reasons.

The first advantage of the present invention, i.e. an improvement of the adhesiveness between the underlying layer and amorphous carbon film 4, is obtained by forming the initial layer 3 containing Si—C bonds on the surface of the underlying layer and then forming the amorphous carbon film 4 by thermal film formation.

The second advantage of the present invention, i.e. an improvement of the adhesiveness between the amorphous carbon film 4 and upper film 7, is obtained by forming the intermediate layer 5 containing Si—C bonds on the surface of the amorphous carbon film 4, and then forming the barrier film 56 or 58 by thermal film formation using an ALD process, which comprises alternately repeating the organic silicon gas supply (step t8) and the nitrogen-containing gas supply (step t9) or carbon-containing gas supply (t20).

Alternatively, the second advantage of the present invention, i.e. an improvement of the adhesiveness between the amorphous carbon film 4 and upper film 7, is obtained by forming the intermediate layer 5 containing Si—C bonds and then forming the silicon carbide-containing film 9 by thermal film formation both on the surface of the amorphous carbon film 4, and then performing an annealing process on the silicon carbide-containing film 9 in an inactive gas atmosphere at a pressure and a temperature, respectively higher than the pressure and the temperature used in forming the silicon carbide-containing film 9 by thermal film formation.

Accordingly, the specific process conditions shown in the embodiments are mere examples, and they may be changed in accordance with the size of silicon wafer 1, the volume of the process chamber, and so forth, unless the advantages described above are deteriorated.

The film formation methods according to the embodiments can provide a film with a thickness of the order of nanometers, and so they may be preferably applied to processes for manufacturing semiconductor devices. The film formation methods according to the embodiments can provide an amorphous carbon film having high adhesiveness to the underlying layer and/or upper film. Consequently, a laminated structure including an amorphous carbon film according to each of the embodiments is most preferably applied to a hard mask used as an etching mask in manufacturing semiconductor devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a laminated structure including an amorphous carbon film, which is a film consisting of amorphous carbon, on an underlying layer consisting of $SiO_2$ on each of target objects, the method comprising:

forming an initial layer of Si—C bonds, which is to improve adhesiveness between the underlying layer and the amorphous carbon film, on a surface of the underlying layer inside a process chamber with the target objects placed therein at intervals in a vertical direction, by supplying an organic silicon gas as a pretreatment gas into the process chamber while heating the target objects, the organic silicon gas being a sole source gas for Si and C of the initial layer of Si—C bonds, and the organic silicon gas being an aminated compound gas containing silicon, which is selected from the group consisting of butylamino silane, bistertialbutylamino silane, dimethylamino silane, bisdimethylamino silane, tridimethylamino silane, diethylamino silane, bisdiethylamino silane, dipropylamino silane, and diisopropylamino silane; and successively forming the amorphous carbon film by thermal film formation on the surface of the underlying layer through the initial layer of Si—C bonds inside the process chamber with the target objects kept placed therein, by supplying a hydrocarbon compound gas as a film formation gas into the process chamber while heating the target objects, the hydrocarbon compound gas being selected from the group consisting of $CH_4$, $C_2H_2$, $C_2H_4$, $C_2H_6$, $C_4H_6$ to thereby form the amorphous carbon film on the underlying layer through the initial layer of Si—C bonds.

2. The method according to claim 1, wherein said forming the initial layer of Si—C bonds uses a process temperature of 20 to 750° C. and a process pressure of 0.05 to 50 Torr, and said forming the amorphous carbon film uses a process temperature of 300 to 1,000° C. and a process pressure of 1 to 650 Torr.

3. The method according to claim 1, wherein the laminated structure is a hard mask to be used as an etching mask in a process for manufacturing semiconductor devices.

4. The method according to claim 1, wherein the organic silicon gas is bistertialbutylamino silane, and the hydrocarbon compound gas is $C_2H_2$.

5. The method according to claim 1, wherein said forming the amorphous carbon film supplies only the hydrocarbon compound gas as a process gas into the process chamber.

6. A method for forming a laminated structure including an amorphous carbon film, which is a film consisting of amorphous carbon, on an underlying layer consisting of $SiO_2$ on each of target objects, the laminated structure being a hard mask to be used as an etching mask in a process for manufacturing semiconductor devices, the method comprising:

forming an initial layer of Si—C bonds, which is to improve adhesiveness between the underlying layer and the amorphous carbon film, on a surface of the underlying layer inside a process chamber with the target objects placed therein at intervals in a vertical direction, by supplying an organic silicon gas as a pretreatment gas into the process chamber while heating the target objects, the organic silicon gas being a sole source gas for Si and C of the initial layer of Si—C bonds, and the organic silicon gas being an aminated compound gas containing silicon, which is selected from the group consisting of butylamino silane, bistertialbutylamino silane, dimethylamino silane, bisdimethylamino silane, tridimethylamino silane, diethylamino silane, bisdiethylamino silane, dipropylamino silane, and diisopropylamino silane;

successively forming the amorphous carbon film by thermal film formation on the surface of the underlying layer through the initial layer of Si—C bonds inside the process chamber with the target objects kept placed therein, by supplying a hydrocarbon compound gas as a film formation gas into the process chamber while heating the target objects, the hydrocarbon compound gas being selected from the group consisting of $CH_4$, $C_2H_2$, $C_2H_4$, $C_2H_6$, $C_4H_6$ to thereby form the amorphous carbon film on the underlying layer through the initial layer of Si—C bonds;

successively forming an intermediate layer of Si—C bonds on a surface of the amorphous carbon film inside the process chamber with the target objects kept placed therein, by supplying the organic silicon gas, which is a sole source gas for Si and C of the intermediate layer of Si—C bonds, into the process chamber;

successively forming a barrier film containing silicon nitride and having a predetermined thickness by thermal film formation on the surface of the amorphous carbon film through the intermediate layer of Si—C bonds inside the process chamber with the target objects kept placed therein, by supplying a reactive gas containing nitrogen and supplying the organic silicon gas alternately into the process chamber a plurality of times; and thereafter forming an upper film containing silicon on the barrier film such that the upper film is positioned above the amorphous carbon film in the laminated structure.

7. The method according to claim 6, wherein the upper film is an $SiO_2$ film.

8. The method according to claim 6, wherein the reactive gas is $NH_3$ gas.

9. The method according to claim 6, wherein the upper film is formed by CVD.

10. The method according to claim 6, wherein, when said intermediate layer of Si—C bonds and said barrier film are formed, the organic silicon gas is supplied under a process temperature of 20 to 750° C. and a process pressure of 0.05 to 50 Torr, and the reactive gas is supplied under a process temperature of 20 to 750° C. and a process pressure of 0.05 to 750 Torr.

11. The method according to claim 6, wherein said forming the upper film is performed inside a secondary process chamber other than the process chamber.

12. The method according to claim 6, wherein the organic silicon gas is bistertialbutylamino silane, and the hydrocarbon compound gas is $C_2H_2$.

13. The method according to claim 6, wherein said forming the amorphous carbon film supplies only the hydrocarbon compound gas as a process gas into the process chamber.

14. A method for forming a laminated structure including an amorphous carbon film, which is a film consisting of amorphous carbon, on an underlying layer consisting of $SiO_2$ on each of target objects, the laminated structure being a hard mask to be used as an etching mask in a process for manufacturing semiconductor devices, the method comprising:

forming an initial layer of Si—C bonds, which is to improve adhesiveness between the underlying layer and the amorphous carbon film, on a surface of the underlying layer inside a process chamber with the target objects placed therein at intervals in a vertical direction, by supplying an organic silicon gas as a pretreatment gas into the process chamber while heating the target objects, the organic silicon gas being a sole source gas for Si and C of the initial layer of Si—C bonds, and the organic silicon gas being an aminated compound gas containing silicon, which is selected from the group consisting of butylamino silane, bistertialbutylamino silane, dimethylamino silane, bisdimethylamino silane, tridimethylamino silane, diethylamino silane, bisdiethylamino silane, dipropylamino silane, and diisopropylamino silane;

successively forming the amorphous carbon film by thermal film formation on the surface of the underlying layer through the initial layer of Si—C bonds inside the process chamber with the target objects kept placed therein, by supplying a hydrocarbon compound gas as a film formation gas into the process chamber while heating the target objects, the hydrocarbon compound gas being selected from the group consisting of $CH_4$, $C_2H_2$, $C_2H_4$, $C_2H_6$, $C_4H_6$ to thereby form the amorphous carbon film on the underlying layer through the initial layer of Si—C bonds;

successively forming an intermediate layer of Si—C bonds on a surface of the amorphous carbon film inside the process chamber with the target objects kept placed therein, by supplying the organic silicon gas, which is a sole source gas for Si and C of the intermediate layer of Si—C bonds, into the process chamber; and successively forming a barrier film containing silicon carbide and having a predetermined thickness by thermal film formation on the surface of the amorphous carbon film through the intermediate layer of Si—C bonds inside the process chamber with the target objects kept placed therein, by supplying a reactive gas consisting of the hydrocarbon compound gas and supplying the organic silicon gas alternately into the process chamber a plurality of times; and thereafter forming an upper film containing silicon on the barrier film such that the upper film is positioned above the amorphous carbon film in the laminated structure.

15. The method according to claim 14, wherein the upper film is an $SiO_2$ film.

16. The method according to claim 14, wherein the upper film is formed by CVD.

17. The method according to claim 14, wherein, when said intermediate layer of Si—C bonds and said barrier film are formed, the organic silicon gas is supplied under a process temperature of 20 to 750° C. and a process pressure of 0.05 to 50 Torr, and the reactive gas is supplied under a process temperature of 20 to 750° C. and a process pressure of 0.05 to 750 Torr.

18. The method according to claim 14, wherein said forming the upper film is performed inside a secondary process chamber other than the process chamber.

19. The method according to claim 14, wherein the organic silicon gas is bistertialbutylamino silane, and the hydrocarbon compound gas is $C_2H_2$.

20. The method according to claim 14, wherein said forming the amorphous carbon film supplies only the hydrocarbon compound gas as a process gas into the process chamber.

* * * * *